March 4, 1952 B. L. SNAVELY ET AL 2,588,172

BUS BAR ASSEMBLY, INCLUDING LONGITUDINAL SOLDER-FILLED RECESS

Filed Dec. 27, 1948

Inventors
Benjamin L. Snavely and
John V. Atanasoff
By Cushman, Darby & Cushman
ATTORNEYS Patented Mar. 4, 1952

2,588,172

UNITED STATES PATENT OFFICE 2,588,172

BUS BAR ASSEMBLY INCLUDING LONGITUDINAL SOLDER-FILLED RECESS

Benjamin L. Snavely, Takoma Park, and John V. Atanasoff, Fulton, Md.

Application December 27, 1948, Serial No. 67,323

8 Claims. (Cl. 173—324)

This invention relates to bus bars and to assemblies of bus bars. More particularly, it is concerned with recessed bus bars which are adapted for connecting together different circuit elements of electronic circuits by soldering the circuit elements or their leads to the bus bars.

In assembling many types of electronic circuits, such as radio or similar low level circuits, many leads from different circuit elements must be connected together. Bus bars have been employed for this purpose so as to reduce the length of separate leads from the separate circuit elements, e. g., a bus bar is quite commonly used as a ground in electronic circuits. In addition, bus bars are also used as power supply leads, e. g., leads to the heater elements of vacuum tubes, or for joining together any circuit element which connects to a common potential.

The soldering of leads to these bus bars has always presented a troublesome situation. Thus, in order to provide the required rigidity in the bus bars, bars of fairly large cross section, equivalent to No. 12 AWG wire or larger have been used. This has generally resulted in increasing length of time to make the solder joint, because of two reasons. First, the large cross section of the bar conducts heat away from the point to be soldered increasing the time required to bring it to soldering temperature. Secondly, unless the lead to be soldered is wrapped around the cylindrical bus bar, the solder is apt to run off the joint completely.

Time consumed in making soldering joints is an important item in research and development work upon experimental electronic circuits because of the obvious hindrance to the skilled engineer or technician. In this type of work, it is particularly desirable to have a bus bar for making common connections which eliminates the disadvantages associated with bus bars used heretofore, as discussed above. It is especially important in the experimental and development type of work to have bus bars which do not require the lead to be wrapped around the bar because, not only does this waste valuable time, but the wrapped lead is quite frequently destroyed when it is removed, thus impairing the value of the resistor, condenser or other circuit element of which it may be a part.

A principal object of this invention is the provision of new forms of bus bars for use in connecting together different circuit elements of an electronic circuit. Further objects include:

(1) The provision of new assemblies comprising a multiplicity or gang of such new bus bars.

(2) The provision of new bus bars which permit leads to be soldered thereto without loss of solder by dropping or running off from the bar, at the same time eliminating need for the lead to be wrapped about the bar.

(3) The provision of such bus bars which have a high degree of rigidity relative to their cross section, thus reducing conduction of heat away from a soldering point to a minimum.

(4) The provision of unique methods of holding a plurality of such bus bars in spaced relationship and permitting such an assembly of bars and holders to be readily connected or fastened to a circuit or chassis.

(5) The provision of such bus bars and bus bar assemblies to which leads from external circuits or power sources can be instantaneously attached or disconnected through detachable sockets.

(6) The provision of bus bars and assemblies thereof which may be employed as components in experimental chassis, i. e., "breadboards."

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

These objects are accomplished according to the present invention by forming a bar from conductive metal, providing the bar, on its upper or outer surface, with a recess and then filling this recess with solder. Such recessed bars are then formed into assemblies of two or more bars by means of cross members which hold the bars at a fixed distance from one another.

A more complete understanding of the new bus bars provided by this invention and the assemblies incorporating these bars may be had by reference to the accompanying drawings, in which.

Figure 4:
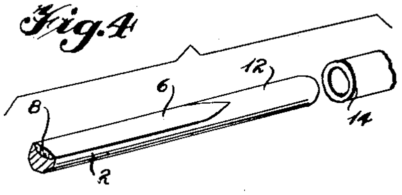
Figure 4 is a perspective view partly in section of one form of a bus bar of this invention.
Figure 5:
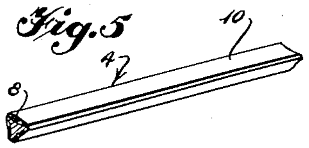
Figure 5 is a perspective view partly in section of another form of our bus bar.

Referring in detail to the drawings, the bus bars of this invention may be formed in any desirable shape, but are preferably in the form of a cylindrical rod 2, as shown in Figure 4, or a triangular rod 4, as shown in Figure 5. The outer surface of the rod is provided with a recess, slot or groove 6 which is filled with solder 8.

The bus bar may be produced, for example, by taking a cylindrical rod or wire and milling a recess 6 therein and then placing molten solder in the recess, excess solder being removed while it is still in the molten state and the solder being fluxed to the sides of the recess.

On the other hand, the triangularly shaped rod, such as 4, may be formed by passing a wire or cylindrical rod through a set of rollers. In this form of bus bar, one of the recesses 10 of the rod is filled with solder, as in the case of the bar which is shown in Figure 4. This form of bus bar is particularly noteworthy because it provides a maximum amount of rigidity, while, at the same time, it has a relatively small cross section so that there is a minimum amount of heat conduction away from a soldering point when a lead or other element is soldered to the bar.

The entire length of the bus bars may be recessed so that connections can be made along the entire length of the bar by soldering. However, the preferred forms of the bus bars of this invention have recesses which stop short of the ends of the bars, as can be seen in Figure 4, and the ends of the bars are shaped so as to form a plug which may be inserted in a mating, detachable socket, such as the pin end 12 formed on the bar 2, which detachably connects with the barrel-type socket 14, shown in Figure 4. This provision of plug ends upon the bus bars permits leads to external circuits and power sources to be substantially instantaneously made or broken merely by slipping the detachable socket on or off the plug.

Figure 1:
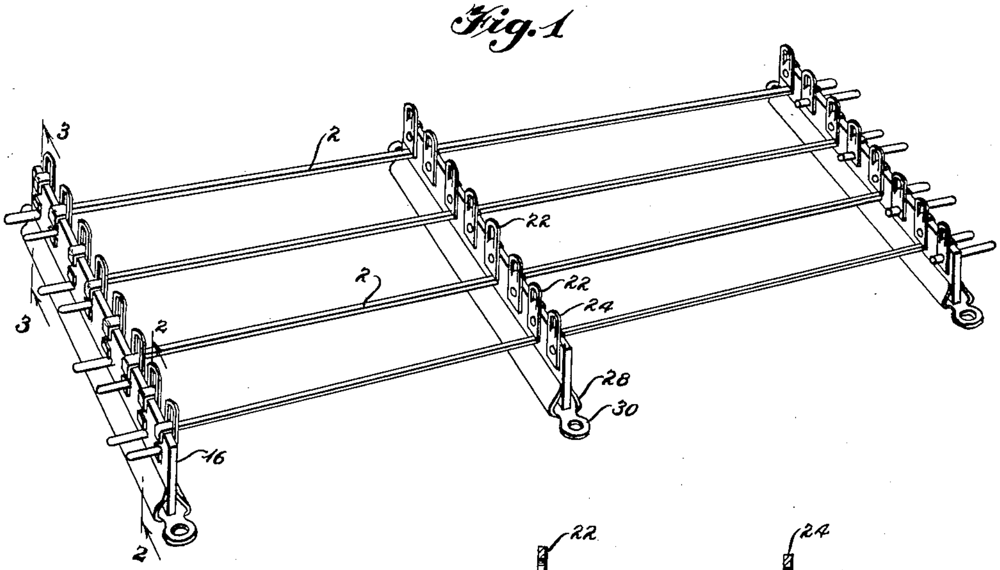
Figure 1 is a perspective view of a bus bar assembly in accordance with the present invention.

In order to form units for use in construction of electronic circuits, the bus bars of this invention are preferably incorporated into multi-bar assemblies. While it is possible to form such assemblies of various length bars, it is preferable to make the assemblies from bars all having the same length and to align the ends of the bars, as shown in Figure 1. Although the bars can be spaced from each other in any desirable fashion, it is most practical to fix them parallel with one another. Furthermore, various means can be used to hold the bars in assembled position, but we have found that this can best be done by the use of insulating strips 16. Holes 18 are drilled through the insulating strips 16 and the bus bars are passed through said holes. For the purpose of assemblage, all of the solder-containing recesses of the bus bars should be fastened in the same direction so that it is desirable to employ some means for preventing rotation of the bars within the insulating strips and also to prevent longitudinal motion of the bars with respect to the strips. One way of accomplishing this, is to make the size of the holes 18 relative to the size of the bars which pass therethrough, such that the bars are press-fitted into the strips. Another way of accomplishing this is to pass the bars through eyelets, hollow rivets or terminal lugs which are crimped to the insulating strip and to which the bars are soldered.

If it is desired to permit the bar to be rotated within the strip, at the same time preventing longitudinal relative movement between the bar and strip, this can be done by reducing the cross section of the end of the bar 2 so as to form a shoulder 20 near the end of the bar which will bear against the inner side of the strip 16 when the bar is assembled therein.

With the bars soldered to the terminal lugs 22 which extend from the strip 16, it is possible to make permanent electrical connections to the bars 2 by soldering leads to the lugs 22. This type of connection can be used either separately or in conjunction with the detachable arrangement using the sockets 14, as described above.

In order to increase the adaptability and usefulness of the bus bar assemblies, additional terminal lugs 24 may be fastened to the strips 16 and pin-type connectors 26 may be soldered to these lugs 24. This permits leads to be permanently soldered to the lugs 24 so that the leads may be instantaneously connected to external circuits through the pin connectors 26 in the same manner as described in connection with the bus bars.

Figure 2:
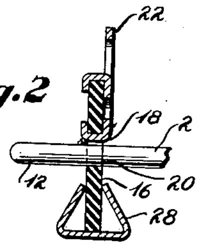
Figure 2 is a partial sectional view of the end portion of the assembly shown in Figure 1, taken along the line 2—2 of Figure 1.
Figure 3:
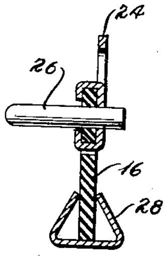
Figure 3 is a partial sectional view of the assembly of Figure 1 taken along the line 3—3 of Figure 1.

Some means is preferably incorporated in the bar holding members to permit them to be fastened upon a suitable base or chassis. In the form of the assembly shown in Figures 1, 2 and 3, this fastening means consists of metal strips 28 provided at either end with drilled lugs 30, opposite sides of the metal strips 28 being bent upwardly and crimped against the sides of the insulating strips 16.

Figure 6:
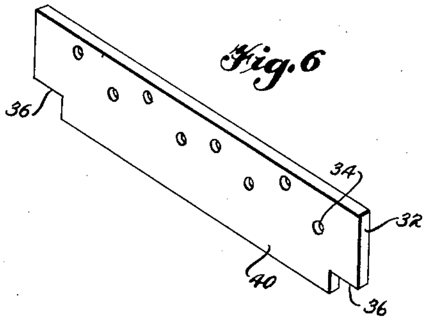
Figure 6 is a perspective view of a means for holding the bus bars of this invention in assembled position.
Figure 7:
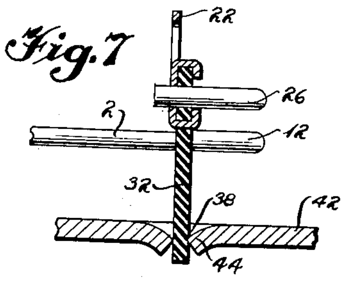
Figure 7 is a side view, partly in section, showing the holder of Figure 6 assembled with bus bars of this invention upon a chassis.

Preferably, however, the assembly fastening means is of the type shown in Figures 6 and 7. In this form, the insulating strips 32 which are provided with holes 34 through which bars 2 or connector pins 26 may be inserted, have the two opposite corners of the bottom side notched out, forming shoulders 36. The remainder of the assembly is the same when the strip members 32 are used as is shown in Figure 1, but no metal fastening means 28 are required with this form. Instead, attachment to a base or chassis is accomplished by forming a slot 38 in the mounting base and inserting the bottom edge 40 of the strip 32 into this slot, until the shoulder 36 engages the top surface of the base 42. In forming the slot of the base 42, tongues 44 are cut of such length that their ends extend beyond the edges of the slot so that when the strip is forced into the slot, these tongues are deformed and press into the sides of the strip 32. The gripping action of the tongues 44 retains the strips securely within the slot 38 and holds the bus bar assembly upon the base 42.

Any desirable type of electrically conductive metal may be used in forming our bus bars. Likewise, any desired type of solder may be used for filling the recess of the bars and, actually, it may be desirable to use special low or high melting solders in special cases.

As can be seen from the above detailed description, this present invention provides new types of bus bars which are uniquely adapted for use in formation of electronic circuits. They are particularly useful, either alone or in the new assemblies provided by this invention, for forming experimental or temporary electronic circuit chassis because they permit leads or other elements to be easily soldered without loss of solder or without requiring the leads to be wrapped about the bars before soldering. In addition, these new units provide saving in time of forming electronic circuits because of the provision of means upon the bars for coupling with detachable connectors which permits instantaneous connection or disconnection of the bars with external circuits or power sources.

We claim:

1. An assembly for use in forming electronic circuits having a plurality of circuit elements with common leads which comprises a plurality of bus bars each with a longitudinal recess in an outer surface having solder fluxed into the recess, a plurality of separating members, said bars being fixed to said members in spaced, parallel relation to one another, with the recesses all in an upward position, the ends of said bars being shaped in the form of connector plugs for insertion into mating detachable sockets.

2. An assembly as claimed in claim 1 wherein the bus bars are all of equal length and the ends of the bars are all aligned.

3. An assembly as claimed in claim 1 wherein said separating members are rectangular strips with holes through which the bars pass perpendicularly to the members.

4. An assembly as claimed in claim 1 wherein the separating members carry upwardly extending terminal lugs which are electrically connected to cooperating bus bars.

5. An assembly as claimed in claim 1 wherein said separating members are rectangular strips with fastening lugs extending from the bottom edge.

6. An assembly as claimed in claim 2 wherein the outermost separating members are fixed adjacent the termination of the bar recesses leaving the plug-shaped ends of the bars extending outwardly from said separating members.

7. An assembly as claimed in claim 3 wherein the ends of said strips are notched out forming shoulders for retaining the member in position within a mating chassis slot.

8. An assembly for use in forming electronic circuits having a plurality of circuit elements with common leads which comprises a plurality of bus bars each with a longitudinal recess in an outer surface having solder fluxed into the recess, a plurality of separating members, said bars being fixed to said members in spaced, parallel relation to one another, with the recesses all in an upward position.

BENJAMIN L. SNAVELY.
JOHN V. ATANASOFF.

REFERENCES CITED

The following references are of record in the file of this patent:

UNITED STATES PATENTS

| Number | Name | Date |
|---|---|---|
| 273,305 | Plankinton | Mar. 6, 1883 |
| 355,611 | Howson | Jan. 4, 1887 |
| 762,840 | Osborn | June 14, 1904 |
| 1,219,228 | Birdsall | Mar. 13, 1917 |
| 1,236,563 | Holmgren | Aug. 14, 1917 |
| 1,905,121 | Adam | Apr. 25, 1933 |
| 2,004,527 | Harvey | June 11, 1935 |
| 2,019,625 | O'Brien | Nov. 5, 1935 |
| 2,037,026 | Hubbell | Apr. 14, 1936 |
| 2,441,698 | Gerspacher | May 18, 1948 |